(12) United States Patent
Yang et al.

(10) Patent No.: US 7,292,444 B1
(45) Date of Patent: Nov. 6, 2007

(54) HEAT SINK FASTENER

(75) Inventors: Bo-Yong Yang, Shenzhen (CN); Yong-Dong Chen, Shenzhen (CN); Guang Yu, Shenzhen (CN); Shih-Hsun Wung, Tu-Cheng (TW); Chun-Chi Chen, Tu-Cheng (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,819

(22) Filed: Oct. 3, 2006

(30) Foreign Application Priority Data

Feb. 17, 2006   (CN) .................. 2006 1 0033841

(51) Int. Cl.
*H05K 7/20* (2006.01)
*H01L 23/34* (2006.01)
*A41F 1/00* (2006.01)
*F28F 7/00* (2006.01)

(52) U.S. Cl. .................. 361/709; 361/710; 361/719; 257/719; 24/458; 165/60.3

(58) Field of Classification Search .............. 361/710, 361/704, 719, 709, 720, 707; 165/80.3, 121, 165/185; 257/719, 727; 174/252; 248/510; 439/485, 487; 24/458, 459, 614
See application file for complete search history.

(56) References Cited

U.S. PATENT DOCUMENTS

| | | | |
|---|---|---|---|
| 5,579,205 A * | 11/1996 | Tustaniwskyj et al. | 361/704 |
| 5,771,155 A * | 6/1998 | Cook | 361/710 |
| 6,344,971 B1 * | 2/2002 | Ju | 361/704 |
| 6,400,572 B1 * | 6/2002 | Wu | 361/704 |
| 6,414,846 B1 * | 7/2002 | Chen | 361/704 |
| 6,450,249 B1 * | 9/2002 | Liu | 165/80.3 |
| 6,644,387 B1 * | 11/2003 | Lee et al. | 165/80.3 |
| 6,731,506 B1 * | 5/2004 | Dong et al. | 361/719 |
| 6,735,085 B2 * | 5/2004 | McHugh et al. | 361/719 |
| 6,785,136 B2 * | 8/2004 | Chang et al. | 361/704 |
| 6,977,816 B2 * | 12/2005 | Lee et al. | 361/704 |
| 2002/0141157 A1 * | 10/2002 | Winkel et al. | 361/703 |
| 2004/0190262 A1 | 9/2004 | Lai et al. | |
| 2005/0144764 A1 | 7/2005 | Lin | |
| 2006/0203452 A1 * | 9/2006 | Barina et al. | 361/704 |

FOREIGN PATENT DOCUMENTS

JP        09229026 A  *  9/1997
JP     2003046044 A  *  2/2003

\* cited by examiner

*Primary Examiner*—Anatoly Vortman
*Assistant Examiner*—Bradley H Thomas
(74) *Attorney, Agent, or Firm*—Jeffrey T. Knapp

(57) ABSTRACT

A heat sink fastener includes a main body, a piercing member and a wire clip. The main body includes a pressing part for holding a heat sink in contact with a heat-generating component, an engaging part and a latching leg; the engaging part and the latching leg are disposed at opposing ends of the pressing part. The piercing member includes a piercing body extending through the engaging part of the main body and a tubular part and a hook. The wire clip includes a pivot shaft pivotally connected with the tubular part of the piercing member, a locking leg for fastening to the main body and a lever interconnecting the pivot shaft and the locking leg together, wherein the lever is rotatable to change the positional relationship between the piercing member and the engaging part of the main body.

16 Claims, 6 Drawing Sheets

HEAT SINK FASTENER

1. FIELD OF THE INVENTION

The present invention relates generally to a heat sink fastener, and more particularly to a heat sink fastener for securing a heat sink to an electronic heat-generating component to remove heat from the heat-generating component.

2. DESCRIPTION OF RELATED ART

Heat sinks are usually used to remove heat from electronic heat-generating components, such as central processing units (CPUs) and the like, to keep the components at specified temperatures. A typical heat sink comprises a base for contacting a heat-generating component to absorb the heat originating from the heat-generating component and a plurality of fins extending from the base for dissipating the heat to ambient air.

To secure the heat sink to the heat-generating component, a fastener is required. A current fastener is disclosed in US Patent Application Publication No. 2005/0144764A1. The fastener comprises a pressing member, an engaging member and a handle. The pressing member comprises an elongated elastic bent section with a hooked end at an end thereof. The hooked end defines an engaging hole therein for engaging with an engaging jut of a base which surrounds the heat-generating component. A slot is defined in an opposite end of the bent section. The engaging member at an end thereof has a joining part which is provided with a fitting hole for receiving another engaging jut of the base. The engaging member at an opposite end thereof has a piercing part which can pass through the slot. The handle at an end thereof is a pivotal end pivotally connected with the piercing part. A cam is provided on the pivotal end. The handle at an opposite end thereof has a pressing part to pivot the handle relative to the engaging member so that the cam is driven to move on the elastic bent section.

In use of the fastener to secure the heat sink to the base, the handle at the pressing part is pressed down to allow the handle to pivot with respect to the pivotal joint of the handle and the engaging member. The cam exerts a force on the elastic bent section such that the elastic bent section can generate tensile deformation against the heat sink to firmly secure the heat sink to the heat-generating component. However, pivoting of the handle about the pivotal joint needs a large amount of space. Pivoting of the handle by hand is done at the risk of damaging other electronic components around the heat-generating component. This makes operation of the fastener awkward.

As well as this, in order to prevent the handle from rotating back, an extension section having a hook at a distal end thereof is provided laterally from the opposite end of the handle. The hook fastens to a lateral side of the base to enhance the engaging effect of the fastener. However, detachment of the hook from the lateral side of the base can be inconvenient.

What is needed is a heat sink fastener which can easily and firmly attach the heat sink to the heat-generating component whilst still can be easily operated to dissemble the heat sink from the heat-generating component. Furthermore, the operation of the heat sink fastener does not occupy a large space.

SUMMARY OF THE INVENTION

A heat sink fastener includes a main body, a piercing member and a wire clip. The main body includes a pressing part for holding a heat sink in contact with a heat-generating component, an engaging part and a latching leg; the engaging part and the latching leg are respectively disposed at opposite ends of the pressing part. The piercing member includes a piercing body extending through the engaging part of the main body and a tubular part and hook formed at two opposing ends thereof. The wire clip includes a pivot shaft pivotally connected with the tubular part of the piercing member, a locking leg for fastening to one end of the main body and a lever extending between the pivot shaft and the locking leg, wherein the lever is rotatable in respect to a pivot shaft pivotably connected to the main body. The piercing member can be moved upwardly or downwardly when the lever is rotated.

Other advantages and novel features will become more apparent from the following detailed description of preferred embodiments when taken in conjunction with the accompanying drawings, in which:

BRIEF DESCRIPTION OF THE DRAWINGS

Many aspects of the heat sink fastener can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION OF THE INVENTION

Figure 1:
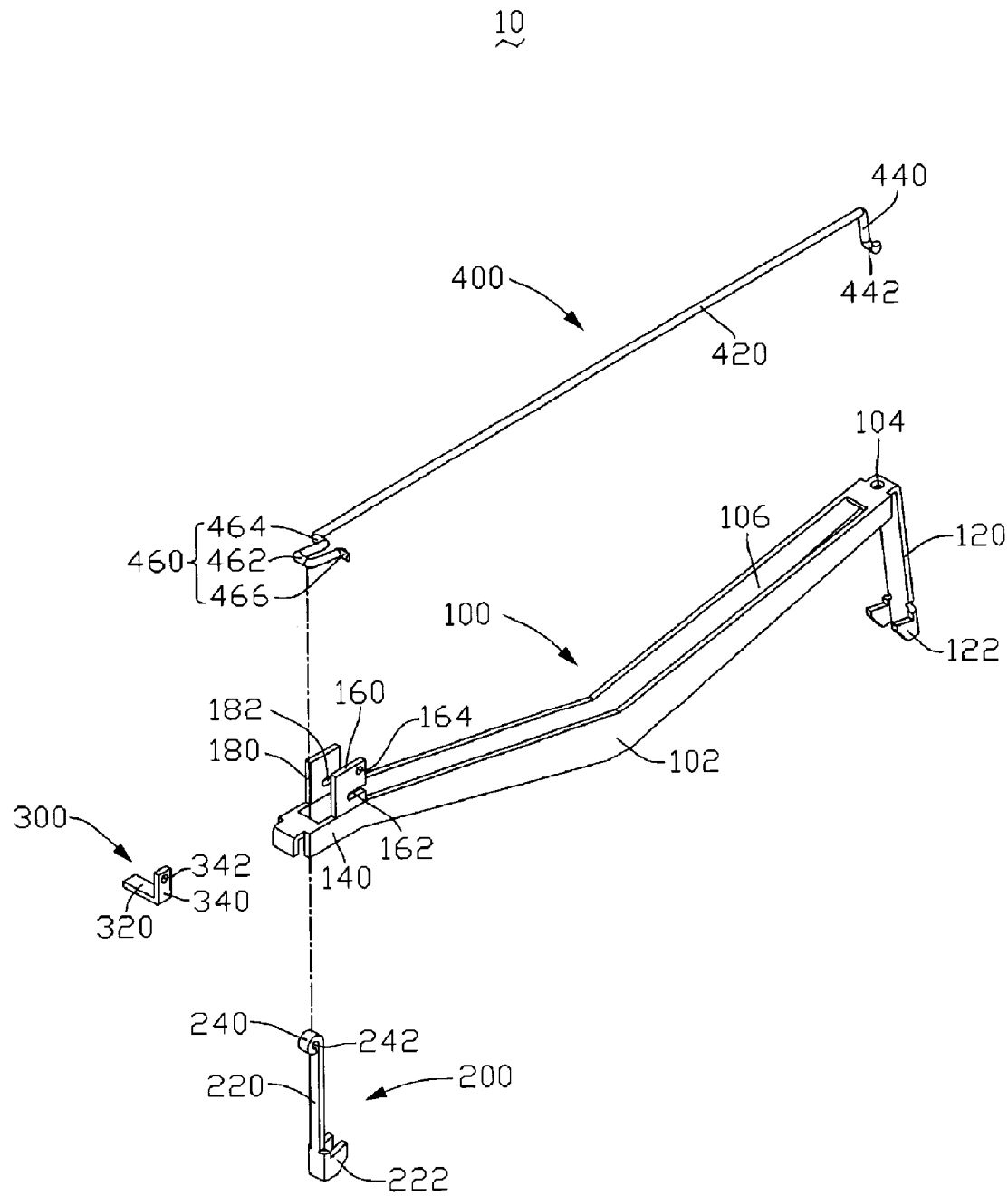
FIG. 1 is an exploded, isometric view of a heat sink fastener in accordance with a preferred embodiment of the present invention.

Referring to FIGS. 1-6, a heat sink fastener 10 in accordance with a preferred embodiment of the invention is used to attach a heat sink 20 which is supported and surrounded by a retention module 30 on a printed circuit board (not shown). The retention module 30 is used, in cooperation with the fastener 10, to fix the heat sink 20 to a heat-generating component such as a CPU (not shown) mounted on the printed circuit board. The retention module 30 comprises two engaging juts 32 at opposite sides thereof. The heat sink 20 comprises a base 22 in contact with a top surface of the heat-generating component and a plurality of fins 24 extending upwardly from the base 22. A channel 26 is defined through the fins 24 and spans between the juts 32 of the retention module 30.

Figure 2:
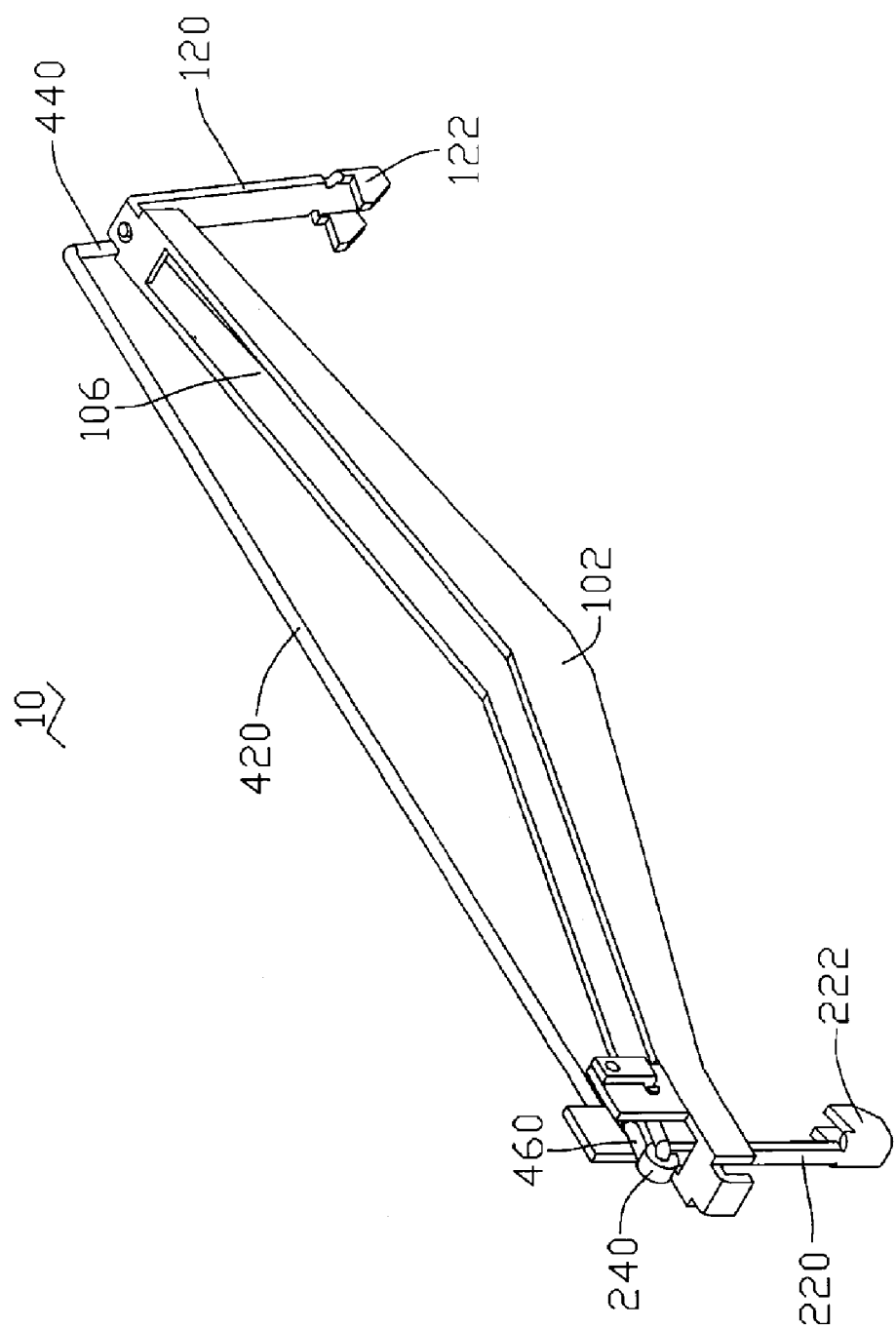
FIG. 2 is an assembled view of FIG. 1.
Figure 3:
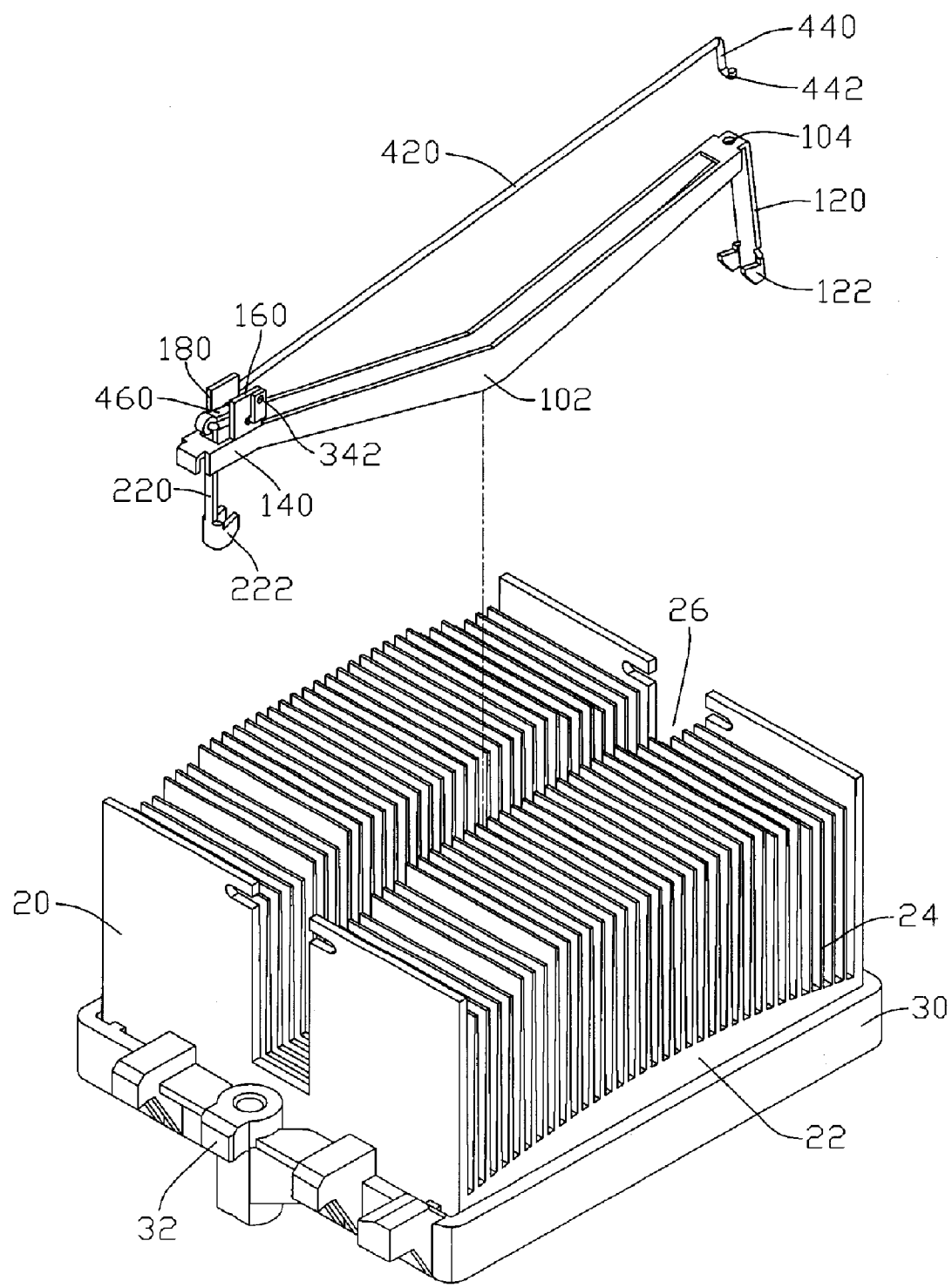
FIG. 3 is an isometric view of the heat sink fastener of FIG. 1, ready to secure a heat sink mounted on a retention module.
Figure 4:
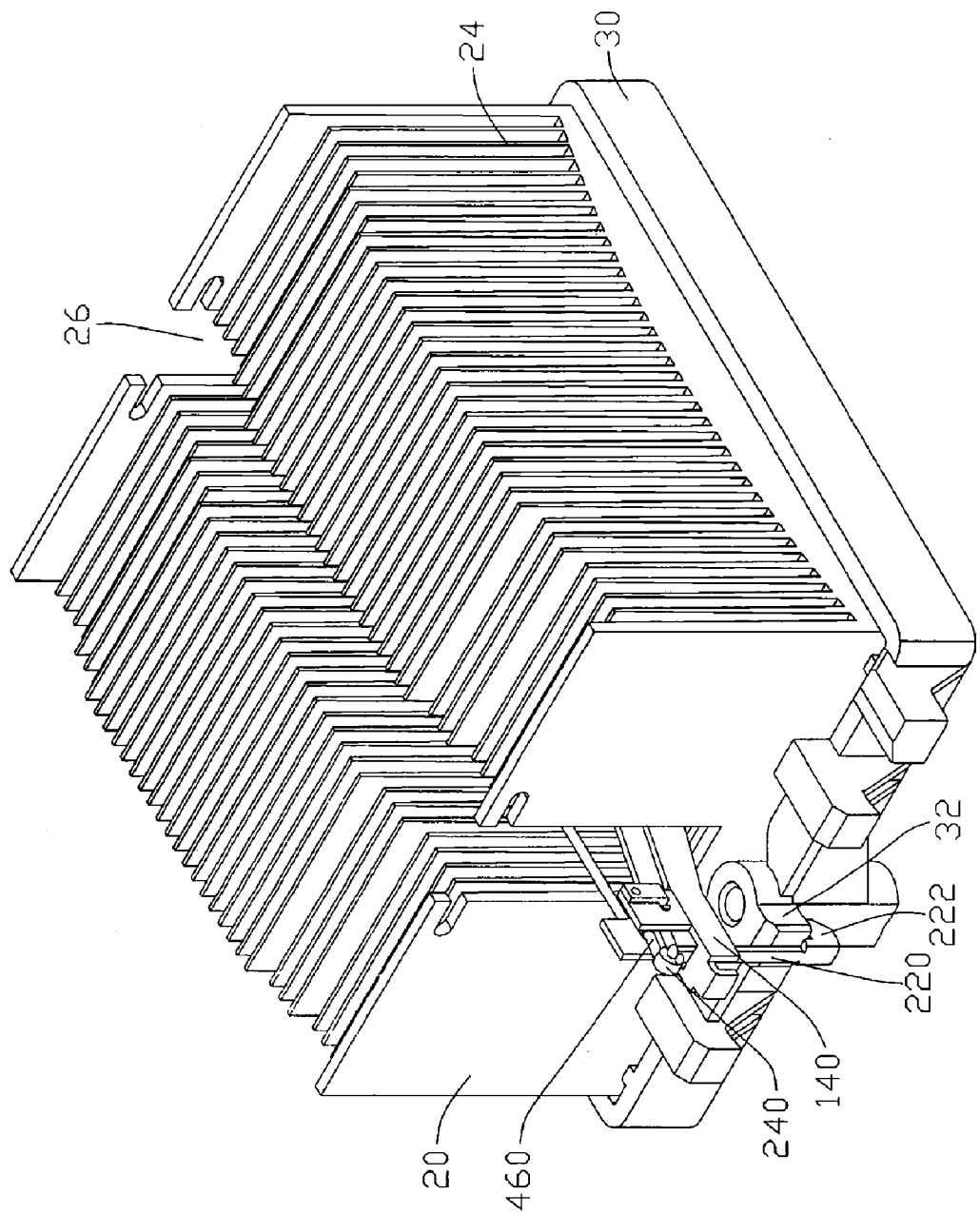
FIG. 4 is an assembled view of FIG. 3.

As illustrated in FIGS. 1 and 2, the heat sink fastener 10 comprises a main body 100, a piercing member 200, a holder 300 and a wire clip 400.

The main body 100 is substantially V-shaped and comprises an elongated pressing part 102, a latching leg 120 and an engaging part 140. The main body 100 defines a fixing hole 104 at an end of the pressing part 102, for engaging with the wire clip 400 and defines an elongated channel 106 extending between two ends thereof. The latching leg 120 extends downwardly and outwardly from the end of the pressing part 102 and inwardly forms a hook 122 at a distal end thereof. The engaging part 140 extends horizontally from an opposite end of the pressing part 102, and comprises two separate engaging sheets 160 and 180 proximal to the pressing part 102. The engaging sheets 160 and 180 are both rectangular, and extend upwardly from opposite lateral sides of the engaging part 140, separated by the channel 106. The engaging sheets 160 and 180 respectively have a pivoting slot 162/182 horizontally extending from a lateral side thereof, opened toward the latching leg 120. The engaging sheet 160 defines an aperture 164 at a corner thereof above the slot 162. Specifically, the channel 106 extends through both the engaging part 140 and the pressing part 102.

The piercing member 200 can be formed from stainless steel and has an elongated piercing body 220 movable upwardly and downwardly through the channel 106 of the main body 100. The piercing body 220 has a hook 222 extending laterally and inwardly at a lower end thereof to face towards the hook 122 of the latching leg 120, and a tubular part 240 formed by curling an upper end thereof outwards. A pivoting hole 242 is thereby defined in the tubular part 240. When the fastener 10 is assembled the tubular part 240 is disposed above the engaging part 140, and the hook 222 faces towards the hook 122 of the latching leg 120 of the main body 100 and is disposed below the engaging part 140.

The holder 300 can be fabricated by stamping a piece of stainless steel. The holder 300 is substantially L-shaped, and comprises a horizontal long portion 320 and a vertical short portion 340. The short portion defines an aperture 342 corresponding to the aperture 164 of the engaging sheet 160 for receiving a bolt (not shown) therein thereby securely connecting the holder 300 and the engaging sheet 160 together.

The wire clip 400 is made of a single piece of elastic steel wire. The wire clip 400 comprises a pivot shaft 460, a lever 420 and a locking leg 440. The pivot shaft 460 and the locking leg 440 extend from opposite ends of the lever 420. The pivot shaft 460 comprises a connecting section 462, and two pivot sections 464 and 466. The two pivot sections 464 and 466 are substantially in line with each other and sandwich the connecting section 462 therebetween. The connecting section 462 is outwardly offset from and parallel to the pivot sections 464 and 466. The lever 420 is linear, and extends perpendicularly from a free end of the pivot section 464, spanning between two opposite ends of the pressing part 102 of the main body 100. The lever 420 is slightly tilted from a plane determined by the pivot shaft 460. The locking leg 440 is downwardly bent from an end of the lever 420 and is remote from the pivot shaft 460. A catch 442 is formed at a distal end of the locking leg 440 for engaging with the fixing hole 104.

FIG. 2 shows the fastener 10 in an assembled state. The pivot sections 464 and 466 are accommodated in the slots 162, 182 of the engaging sheets 160 and 180 respectively. The vertical short portion 340 of the holder 300 is secured to the engaging sheet 160 by inserting the bolt into the aligned apertures 342 and 164. The horizontal long portion 320 of the holder 300 is positioned in the slots 162, 182 to prevent the pivot sections 464, 466 from sliding out of the slots 162, 182. The piercing body 220 extends through the channel 106 of the main body 100 and pivotally connects to the connecting section 462 of the pivot shaft 460 by receiving the connecting section 462 in the pivot hole 242 of the piercing member 200.

Referring to FIGS. 3-6, to mount the heat sink 20 on the retention module 30, the fastener 10 rests on the heat sink 20 between the juts 32. The catch 442 of the wire clip 400 is suspended above the fixing hole 104 of the main body 100 (see FIG. 5). The pressing part 102 of the fastener 10 is positioned in the channel 26 of the heat sink 20. The hooks 122, 222 of the latching leg 140 and the piercing member 200 respectively loosely engage the juts 32 of the retention module 30.

Figure 5:
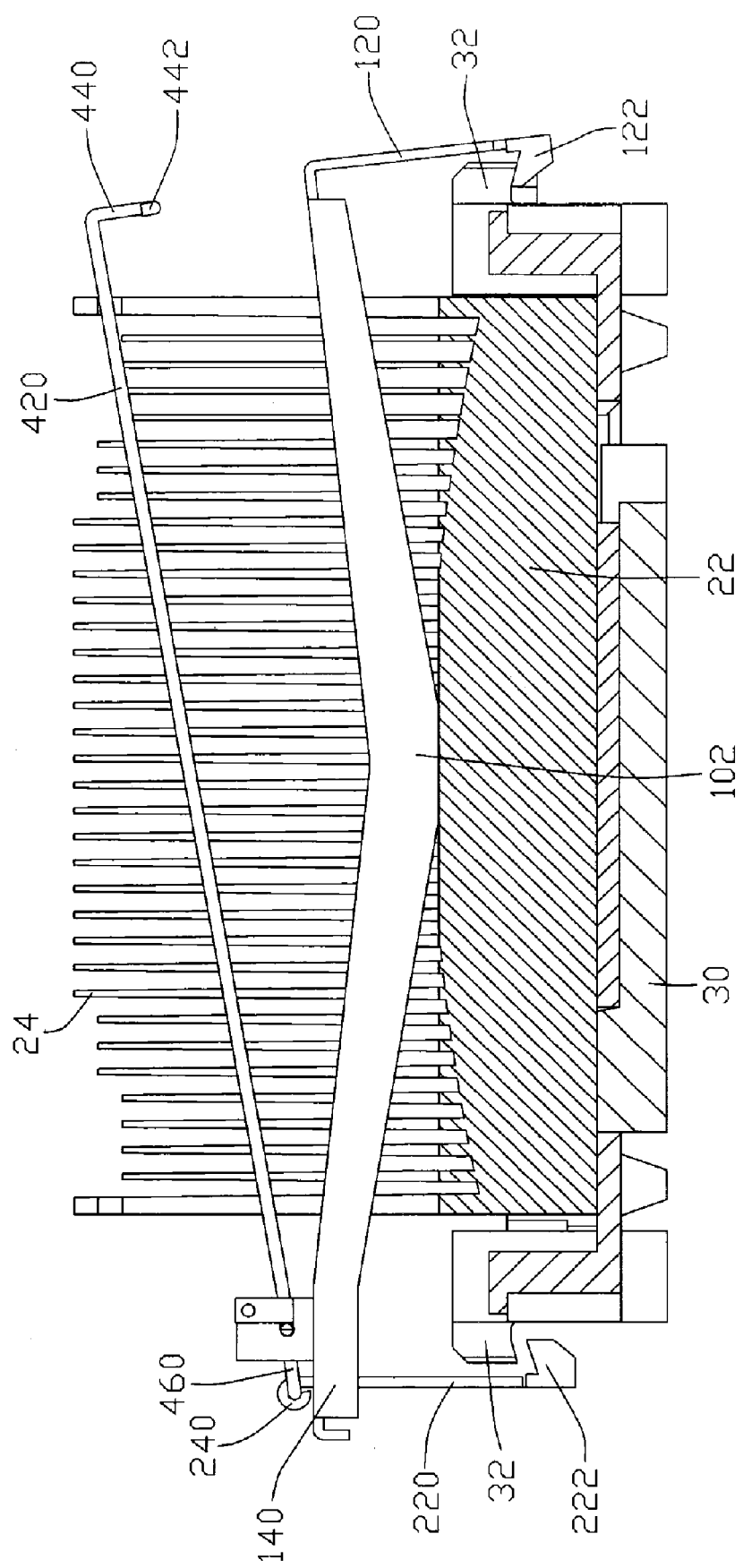
FIG. 5 is a cross-sectional view of an assembly of the components of FIG. 3, but with the fastener in an unlocked position.
Figure 6:
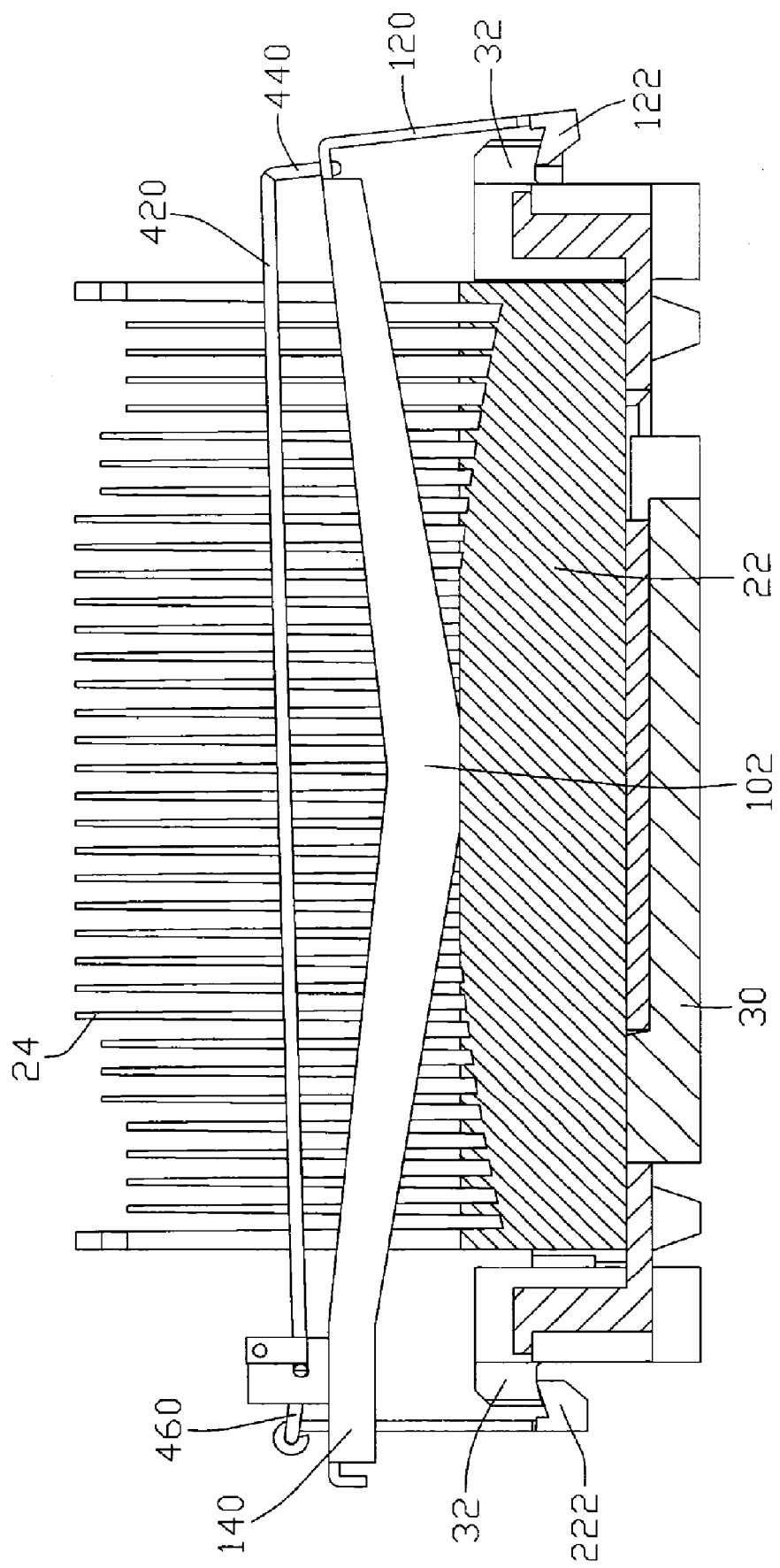
FIG. 6 is similar to FIG. 5, but with the fastener in a locked position.

Particularly referring to FIGS. 5 and 6, the lever 420 of the wire clip 400 is pressed to pivot downwardly relative to the pivot sections 464 and 466 thus engaging the catch 442 at one end of the lever 420 with the fixing hole 104 of the main body 100. When the lever 420 is pivoting, the pivot sections 464 and 466 serve as fulcrums of a leverage. When the lever 420 moves downwards, the connecting section 462 at another end of the clip 400 moves upwards relative to the pivot sections 464 and 466. The piercing member 200 with the connecting section 462 lifts thus forcing the hook 222 of the piercing member 200 to tightly fasten to the corresponding jut 32. The pivot section 464 and 466 serving as fulcrum exerting a counterforce on the engaging sheets 160 and 180 to make the pressing part 102 press against the base 22 of the heat sink 20 and the hook 122 of the latching leg 120 is simultaneously lifted so as to fasten to the corresponding jut 32 of the retention module 30. At this time, the heat sink 20 is firmly mounted to the retention module 30 and intimately contacts the heat-generating component.

To detach the heat sink 20 from the retention module 30, the catch 442 of the wire clip 400 is disengaged from the fixing hole 104 of the main body 100 and the lever 400 then rebounds to a position above the main body 100. The piercing member 200 descends, having the hook 222 loosely catching the corresponding jut 32 of the retention module 30. At the same time the latching leg 120 of the main body 100 descends, having the hook 122 loosely catching the corresponding jut 32 of the retention module 30. At this time, the fastener 10 can be removed, and the heat sink 20 can thus be detached from the retention module 30.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink fastener comprising:
   a main body comprising an elongated pressing part adapted for holding a heat sink in contact with a heat-generating component, wherein the pressing part has an engaging part and a latching leg at opposing ends of the pressing part;
   a piercing member comprising a piercing body extending through the engaging part of the main body, a tubular part curled from one end thereof and a hook extending from an opposite end thereof; and
   a wire clip comprising a lever spanning between two opposite ends of the main body, a pivot shaft and a locking leg at opposite ends of the lever, wherein the pivot shaft comprises two pivot sections held on the engaging part of the main body serving as a fulcrum and a connecting section received in the tubular part of the piercing member, the lever is rotatable relative to each pivot section to lift or lower the piercing member along with the connecting section.

2. The heat sink fastener as claimed in claim 1, wherein the connecting section of the wire clip is sandwiched between the two pivot sections, and is positioned parallel to and offset from the two pivot sections.

3. The heat sink fastener as claimed in claim 1, wherein the engaging part of the main body has two engaging sheets extending perpendicularly and upwardly therefrom.

4. The heat sink fastener as claimed in claim 3, wherein the two engaging sheets are each provided with a slot recessing from a lateral side thereof adjacent to the pressing part of the main body.

5. The heat sink fastener as claimed in claim 4, wherein the two pivot sections of the wire clip are pivotally accommodated in the slots and secured by a holder inserted into the slots.

6. The heat sink fastener as claimed in claim 1, wherein the locking leg of the wire clip is bent perpendicularly from the lever and defines a catch extending laterally from a distal end thereof.

7. The heat sink fastener as claimed in claim 6, wherein the catch of the locking leg is fastened to one end of the main body near the latching leg to keep the heat sink fastener in a locked position.

8. The heat sink fastener as claimed in claim 1, wherein the main body forms a channel for the piercing member to extend therethrough.

9. A fastener comprising:
   a main body comprising a pressing part adapted for holding a heat sink in contact with a heat-generating component, an engaging part and a latching leg, the engaging part and the latching leg being disposed at opposite ends of the pressing part;
   a piercing member comprising a piercing body extending through the engaging part of the main body, a tubular part and a hook respectively formed at two opposite ends thereof; and
   a wire clip comprising a pivot shaft pivotally connected with the tubular part of the piercing member, a locking leg fastened to the end of the pressing part at which the latching leg is formed and a lever interconnecting the pivot shaft and the locking leg, wherein the lever is rotatable to change positional relationship between the piercing member and the engaging part of the main body.

10. The fastener as claimed in claim 9, wherein the pivot shaft of the wire clip comprises two pivot sections aligned with each other and a connecting section sandwiched between and offset from the two pivot sections.

11. The fastener as claimed in claim 10, wherein the connecting section is received in the tubular part of the piercing member to couple the piercing member to the wire clip.

12. The fastener as claimed in claim 10, wherein the two pivot sections are pivotally held above the engaging part of the main body.

13. The fastener as claimed in claim 12, wherein the engaging part of the main body has two engaging sheets extending perpendicularly and upwardly therefrom.

14. The fastener as claimed in claim 13, wherein the two engaging sheets each have a slot recessing from a lateral side thereof adjacent to the pressing part of the main body to pivotally accommodate the two pivot sections.

15. A heat dissipation device comprising:
   a retention module adapted to be mounted on a printed circuit board and surround a heat-generating electronic component;
   a heat sink mounted on the retention module, adapted for thermally connecting with the heat-generating electronic component;
   a fastener comprising:
   an elongated main body having a pressing part spanning across the heat sink and pressing the heat sink toward the retention module, a latching leg extending downwardly from an end of the pressing part and securely engaging with a jut of the retention module, and an engaging part formed on an opposite end of the pressing part;
   a piercing member extending through the engaging part of the main body and having an upper pivoting end and a lower hook securely engaging with another jut of the retention module; and
   a wire clip having a pivot shaft formed on an end thereof, a catch formed on an opposite end thereof and fastening with the end of the pressing part at which the latching leg is formed and a lever between the pivot shaft and the catch, the pivot shaft having a pivot section pivotably connected to the engaging part of the elongated main body and a connecting section connecting with the upper pivoting end of the piercing member.

16. The heat dissipation device as claimed in claim 15, wherein when the catch is released from the end of the pressing part at which the latching leg is formed, the secure engagement between the latching leg and the jut of the retention module is released.

\* \* \* \* \*